United States Patent [19]

Scott

[11] Patent Number: 5,422,917
[45] Date of Patent: Jun. 6, 1995

[54] FREQUENCY OFFSET ESTIMATION USING THE PHASE ROTATION OF CHANNEL ESTIMATES

[75] Inventor: Kenneth E. Scott, Calgary, Canada

[73] Assignee: NovAtel Communications Ltd., Alberta, Canada

[21] Appl. No.: 245

[22] Filed: Jan. 4, 1993

[51] Int. Cl.$^6$ ............................ H04L 7/00; H04L 25/36; H04L 25/40
[52] U.S. Cl. ........................................ 375/371; 375/362; 327/3; 327/40
[58] Field of Search .................... 375/11, 12, 14, 97, 375/111, 118; 364/724.19, 724.2; 455/139, 255, 260, 313; 370/105.3; 307/510, 511

[56] References Cited

U.S. PATENT DOCUMENTS

| | | | |
|---|---|---|---|
| 4,674,103 | 6/1987 | Chevillat et al. | 375/13 |
| 4,947,409 | 8/1990 | Raith et al. | 375/97 |
| 5,049,830 | 9/1991 | Yoshida | 375/97 |
| 5,093,846 | 3/1992 | Walton, Jr. et al. | 375/97 |
| 5,121,414 | 6/1992 | Levine | 375/97 X |
| 5,128,968 | 7/1992 | Yoshida | 375/97 |
| 5,150,380 | 9/1992 | Okanoue | 375/101 |

OTHER PUBLICATIONS

K. Anvari et al, "A Joint Algorithm for Receiver Timing Recovery and AFC, IEEE", pp. 26–30.

*Primary Examiner*—Stephen Chin
*Assistant Examiner*—Bryan Webster
*Attorney, Agent, or Firm*—Cesari and McKenna

[57] ABSTRACT

A receiver (10) for extracting complex values by reference to a local frequency reference determines the frequency offset between a local oscillator (16) and the carrier by employing a circuit (40) for determining a "phase rotation." When a record of the input signal is determined to have resulted from a predetermined reference sequence of complex values, the phase-rotation circuit (40) compares the phases of complex values extracted from this record with corresponding symbols of the reference sequence. By comparing this difference for one part of the sequence with that for another, circuitry (38, 50, 52, 53, 54) in the receiver infers the frequency offset between the transmitter reference and the receiver reference, and a complex multiplier (34) compensates for this offset by multiplying the successive complex-valued samples by a complex exponential whose frequency is the negative of the frequency offset.

5 Claims, 2 Drawing Sheets

FREQUENCY OFFSET ESTIMATION USING THE PHASE ROTATION OF CHANNEL ESTIMATES

BACKGROUND OF THE INVENTION

The present invention is directed to radio receivers of the type employed for digital-signal reception. It particularly concerns the manner in which such receivers maintain the proper frequency relationship between the received signal's carrier and the local oscillator by reference to which the symbol content of the received signal is extracted.

In digital communication systems such as those of the type proposed for North American cellular-telephone traffic, information is transmitted as symbols encoded in the phase of the transmitted signal with respect to its carrier. For proper extraction of the symbols, therefore, the receiver's local reference must be quite close in frequency to the carrier signal; a frequency difference causes the apparent phase relationship to "rotate" undesirably.

Certain transmission protocols have the tendency to reduce this effect. In differential quadrature phase-shift keying ("DQPSK"), the information is contained, not in the absolute phase, but rather in the difference between the phase of a given sample and the phase of the previous sample. In an otherwise ideal transmission channel, therefore, the frequency difference does not present a significant problem so long as the reciprocal of the symbol period is large with respect to the frequency error. In actual practice, however, the channel is not ideal: it is subject to multipath fading and dispersion, so some type of process, such as adaptive equalization, that involves adaptive channel characterization is needed in order to extract symbols accurately from the time-varying channel. Such processes tend not to be very tolerant of significant uncorrected frequency offsets; their effect is to make the channel vary rapidly, and there are limits to the rate at which the adaptive processes can adapt. Even for DQPSK systems, therefore, accurate frequency tracking is necessary in practice.

The conventional approach to frequency tracking is to employ phase-locked-loop systems. That is, the phase of the received signal, or a frequency-translated version of it, is compared with the local phase reference, and the average phase difference over time is used to adjust the frequency of that reference. Unfortunately, phase-locked-loop systems tend to require a fair amount of time to achieve phase lock, and the result in a cellular-telephone system can be an objectionable amount of dead time when the user's equipment is "handed off" from one cell, where one frequency prevails, to another cell, where the base-station equipment does not in general communicate with the user at the same frequency. This is true both for conventional, analog phase-locked-loop systems and for digital equivalents.

Certain other digital techniques perform the local-reference adjustment digitally, relying on data extracted from the carrier in order to estimate the offset. Such techniques are not applicable in a time-dispersive-channel environment, however, because the process for extracting the data depends on adaptive processes, which, as was explained above, are themselves relatively intolerant to significant frequency offsets: such techniques for adjusting the local reference frequency can function only after the local reference frequency has already been adjusted.

One digital approach, described in U.S. patent application Ser. No. 804,424, filed on Dec. 9, 1991, by Scott et al. for Timing and Automatic Frequency Control of Digital Receiver Using the Cyclic Properties of a Non-Linear Operation, employs the average phase relationship between successive received-signal samples to determine not only the frequency offset but also the sampler phase error. In order to attenuate data-dependent effects sufficiently that the frequency- and phase-dependent effects dominate, however, it is necessary to average the phase relationships over a large number of symbols, and this can result in a significant delay in achieving an accurate enough offset estimate.

SUMMARY OF THE INVENTION

I have found that the time required to achieve an accurate enough offset estimate can be minimized, even in systems that are to be used for time-dispersive channels, by adjusting the frequency of the local phase reference in accordance with a "phase rotation" observed in the phase relationship between symbols in a synchronization word or other predetermined symbol sequence known to have been transmitted and complex samples taken from a receiver input-signal record that resulted from transmission of the predetermined sequence.

For example, when it has been determined that a certain record in the received signal bears, say, a predetermined synchronization word employed for such cellular-telephone channels, the phase differences are determined between samples taken during a first part of the record and corresponding symbols in the first part of the (known) synchronization word. These differences are compared with the differences that result when the same process is performed for samples taken from a different part of the record, and the "phase rotation" thus determined is indicative of the frequency offset between the local reference and the carrier. This phase rotation can then be used to adjust the local reference.

Since this approach eliminates the need to average over long periods to filter out data-dependent effects, the time required to achieve adequate frequency-offset compensation is shorter in many important environments than it is for conventional systems.

BRIEF DESCRIPTION OF THE DRAWINGS

These and further features and advantages of the present invention are described below in connection with the accompanying drawings, in which.

DETAILED DESCRIPTION OF AN ILLUSTRATIVE EMBODIMENT

Figure 1:
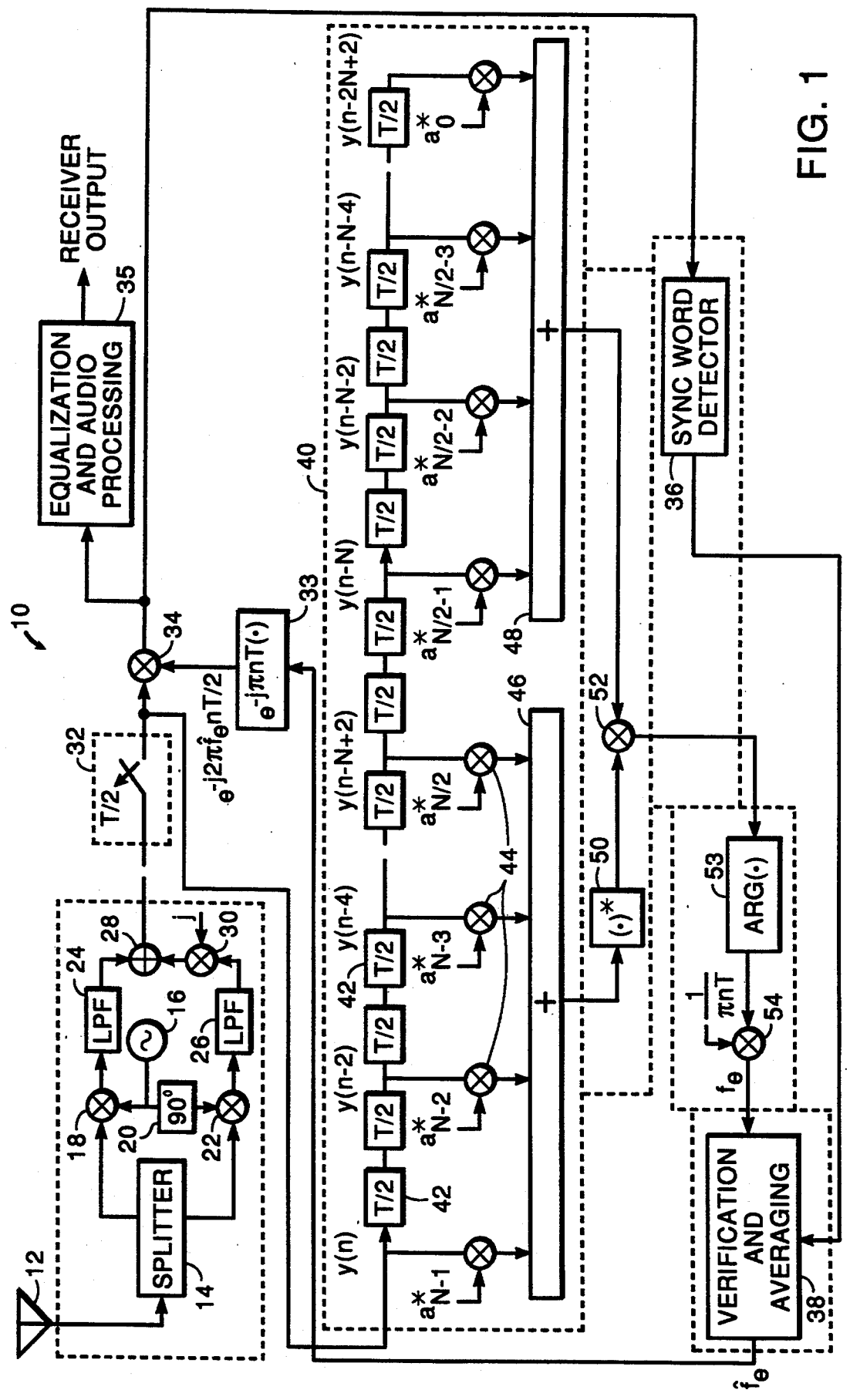
FIG. 1 is a block diagram of a receiver that employs the teachings of the present invention.

Receiver 10 is, for the sake of example, a DQPSK receiver. As is typical in such receivers, the input signal from an antenna 12 is applied to a power splitter 14 either directly or (as is not shown) after translation to an intermediate frequency. A local oscillator 16 applies its output directly to a first mixer 18 and through a 90° phase shifter 20 to a second mixer 22. Low-pass filters 24 and 26 pass only the difference frequencies in the mixers' resultant outputs and thereby produce baseband signals representing the in-phase and quadrature components, respectively, of the signal received. An adder 28 and a multiplier 30 with an input j represent no hardware but instead indicate that in the subsequent, complex operations the quadrature component will be treated as the imaginary part of a complex number whose real part is the output of the upper low-pass filter 24.

The complex-valued output of the "adder" 28 is applied to a pair of digital-to-analog converters represented in the drawing as a single complex-value sampler 32. Sampler 32 takes samples once every T/2, where T is the symbol period. (Of course, the sample period could instead be a different fraction of the symbol period.)

As was stated above, the receiver's local phase reference must be adjusted to keep its frequency close to the transmitter's carrier frequency. Embodiments of the present invention can achieve this adjustment by making oscillator 16 variable in frequency. In the illustrated embodiment, however, the frequency reference is embodied in the combination of a fixed-frequency oscillator 16 and a phase-offset generator 33. A complex multiplier 34 multiplies the nth complex sample by the output $\exp(-j2\pi \hat{f}_e nT/2)$ of generator 33, where $\hat{f}_e$ is a frequency offset determined in a manner that will be described below. It is the resultant input samples that subsequent processing circuitry 35, which may include an adaptive equalizer, uses to produce the receiver output, which is typically speech. These samples are in general complex, of course, but some embodiments may use only the real or only the imaginary components to generate the receiver output from the complex samples.

A sync-word detector 36 also receives the outputs of multiplier 34 and accumulates them to determine whether the most-recently received sequence of symbols represents a sync word. Such detectors are widely used, and any is appropriate for use with the present invention.

When detector 36 detects a sync word, it causes a verification-and-averaging circuit 38 to load in the output of circuitry for determining the phase rotation within a sync word and indicating the frequency offset that the determined phase rotation implies. The phase-rotation part 40 of that circuitry includes a chain of T/2-delay elements 42. These store the last 2N samples of y(n), where N is the length of the sync word. Multipliers 44 multiply every second sample by the conjugate $a_k^*$ of a symbol in the sync word $a_0, a_1, \ldots, a_{N-1}$. In the absence of noise and multipath effects, the result would be that each of the values $y(n), \ldots, y(n-2N+2)$ would be multiplied by a value proportional to its conjugate, and the outputs of all of the complex multipliers would thus have phase angles of zero, if the receiver were completely in synchronization with the transmitter in both frequency and phase and the sequence of samples stored by the delay elements 42 were exactly aligned with the record containing the transmission of that sync word.

If the sample timing is not precisely in phase, on the other hand, the multiplier outputs will have non-zero phase angles. If the frequency is correct, the phase angles of the multiplier-44 products will tend to be approximately the same. But, if there is additionally a frequency offset, the phase angles will progress with delay-chain position: there will be a phase rotation. The illustrated embodiment computes this rotation by employing first and second summation circuits 46 and 48 to add the products from respective first and second parts of the record, and comparing the resultant phase by, for instance, conjugating one of the sums and multiplying it by the other, as blocks 50 and 52 in the diagram indicate. (Of course, those skilled in the art will recognize that a typical implementation of this invention will employ programmable digital-signal-processing circuitry for most of these functions, so many of these functions will be performed in practice by common circuitry even though FIG. 1 depicts them in separate conceptual blocks.)

In response to detector 36's detection of a sync word, the frequency offset indicated by the phase-rotation output of multiplier 52 is used by the verification and averaging circuit 38 to produce the frequency-offset value $\hat{f}_e$ that the phase-offset generator 33 uses. If the frequency offset is $f_e$, then the phase rotation from the first half of the sync word to the second half of the sync word, which is displaced in time from the first half by (N/2)T, will be $\pi NT f_e$ in a perfect channel with no noise or multipath effects. The drawing accordingly employs a phase-extraction block 53 and a block 54 for dividing by $\pi NT$ to represent the circuitry for inferring a frequency offset $f_e$ from the phase rotation. The verification and averaging circuit loads in an $f_e$ value in response to each detection of a sync word by detector 36.

In an ideal situation, the resultant value $f_e$ could be employed directly for reference-frequency correction. In practice, however, the signals upon which the phase rotation and sync-word detection are based will typically have been corrupted by noise and time dispersion, so the frequency-offset determination will also be noisy. Also, the sync-word detector will sometimes produce erroneous detection indications. For the latter reason, the verification and averaging circuit 38 determines whether the detection indication from detector 36 is properly spaced in time from previous detection indications; in the environment in which the illustrated embodiment is to be used, sync words are known to be transmitted at regular intervals, so a detection indication improperly spaced from others is likely to be erroneous, and circuit 38 will accordingly discard the corresponding $f_e$ value. If it is properly timed, however, circuit 38 computes the average $\hat{f}_e$ from the associated $f_e$ value and all other $f_e$ values similarly verified.

Because of multipath considerations, "properly timed" records in some embodiments may not only be those spaced by exactly the interval at which sync words are sent but also those spaced by a slightly different interval. That is, if the signal from only one path is strong enough to result in a detection indication during one header's transmission and that from only one other path is strong enough during the next header's transmission, then the time interval between the detected sync words will differ from the nominal value by the path-length difference. In many embodiments, any such interval will be considered to equal the predetermined time interval by which circuit 38 qualifies $f_e$ values for use in the $\hat{f}_e$ computation. Such arrangements would typically, although not necessarily, accept the $f_e$ values produced by all sync-word detections that result from the same sync-word transmission.

Multiplier 34 multiplies the incoming complex samples by $\exp(-j2\hat{f}_e nT/2)$. This effectively adjusts the local reference in frequency by $-\hat{f}_e$. As was stated above, the frequency adjustment does not have to be performed digitally; one could instead make local oscillator 16 a variable-frequency device such as a voltage-controlled oscillator whose control voltage is proportional to $-\hat{f}_e$.

Although the foregoing description refers to a "sync word" because sync words are predetermined symbol sequences always transmitted as parts of header segments in the scheme to which the illustrated embodiment is directed, those skilled in the art will recognize that the present invention can employ any predetermined sequence or sequences in its stead; all that is necessary is that samples from a received input record be compared with symbols known to have been transmitted to cause the record. Even if the system does employ the sync word, it is not necessary to employ two non-overlapping halves of that word or all symbols of the word as the illustrated embodiment does. One might instead divide the word into, say, three overlapping parts and infer the frequency offset from two or three comparisons, for instance. Indeed, the phase difference determined for one single symbol could in theory be compared with that determined for a single later symbol to obtain the phase rotation. I prefer to use a greater number of symbols, however, in order to reduce noise sensitivity.

The verification and averaging circuit 38 can update its $\hat{f}_e$ value in many ways. The particular approach that I consider desirable for the North American digital cellular system is a one-time correction-frequency determination for each call set-up and each "handoff." In this approach, the verification and averaging circuit 38 keeps its output $\hat{f}_e$ unchanged most of the time. When a call set-up or handoff occurs, however, i.e., when the receiver begins communication with a new base station, circuit 38 begins accumulating $f_e$ values and their times of occurrence until it has identified a sequence of at least two values properly spaced in time. (Of course, the minimum sequence length may instead be three, four, etc.) When the requisite sequence has been identified, the verification and averaging circuit 38 discards those that do not belong to such a sequence, takes the average $\hat{f}_e$ of the others, and uses this value for its output, keeping it unchanged until the next handoff.

In the alternative, of course, one could update the correction frequency $\hat{f}_e$ continually. For this purpose, one could use a rolling average of the M most-recent verified $f_e$ values to compute $\hat{f}_e$. Another possibility would be to use a weighted average:

$$\hat{f}_e(k) = \beta f_e(k) + \alpha \hat{f}_e(k-1), \quad (1)$$

where k is the header index, as opposed to sample index, $0 < \beta \leq 1$, and $0 < \alpha \leq 1$ is the forgetting factor.

Note that the illustrated embodiment extracts from the received signal two different sets of complex input samples referenced to the phase reference. One, applied to the phase-rotation circuitry, is extracted by reference to the phase reference before correction, while the other, from which the receiver output is obtained, is extracted by reference to the phase reference after correction. In this arrangement, $\alpha$ would ordinarily equal $\beta-1$ in a weighted-average version. The use of two different sample sets is not required, however, and in fact is not possible in embodiments that, for example, provide the phase reference as a single voltage-controlled oscillator. One can instead use the same set of complex input samples for both purposes.

Consider, for example, an arrangement in which the input to the phase-rotation circuit is multiplier 34's output rather than its input. This would not necessarily result in generation of the phase-rotation circuit's input by reference to the corrected phase reference if the one-time-per-handoff approach is used; since the receiver output does not need to be accurate during handoff intervals, the output of generator 33 could be set to unity during those intervals, and operation would be the same as that described above. In the case of continual updating, on the other hand, the set of complex input samples used for offset-frequency determination would have to be extracted by reference to the corrected phase reference. In such an arrangement, it would probably be best to use a correction-frequency calculator in which $\alpha$ and $\beta$ are so chosen as to integrate the $f_e$ values and thereby eliminate static error. The above-described weighted average with $\alpha = 1$ and $\beta \leq 1$, for instance, would serve this purpose.

Because of the multipath nature of some cellular-telephone channels, the individual $f_e$ values from which the mean value $\hat{f}_e$ is determined may actually belong to more than one sequence of properly timed values, the different sequences overlapping each other in time. This can be understood by considering one type of sync-word detector. Although, for conceptual purposes, the diagram shows sync-word detector 36 as being separate from the phase-rotation circuit 40, those elements may in fact employ common circuitry. One type of sync-word detector, for instance, would simply compare the magnitude of the sum of the outputs of summation circuits 46 and 48 with a threshold value—i.e., compare with a threshold value the correlation between the known sync word and the record in delay circuits 42—and generate a sync-word-detection output whenever a correlation value exceeds that threshold. In a multipath environment, transmission of a single sync word may cause multiple correlation peaks that exceed the threshold. Each such peak would have the proper timing relationship with a corresponding one of the multiple peaks that result from a subsequent sync word. Accordingly, the frequency-offset values identified by the resultant detection indications could all be (properly) used to compute a correction frequency $\hat{f}_e$.

Performance may benefit if contributions to the computation of the frequency offset $\hat{f}_e$ are weighted in accordance with the correlations between the records and the reference sequence. One way of doing this in multipath environment is to perform the computation of equation (1) separately for each path, i.e., for each set of phase rotations obtained from a set of records spaced from all other records in the set by an integral number of sync-word intervals. The value used for phase-offset computation in offset generator 33 would then be the average of the individual equation (1) results for the different record sets weighted in accordance with the magnitudes of the correlations associated with the records from which the constituent offsets were determined.

Another way, which is effective both in the presence and in the absence of multipath effects, is to weight the individual constituent effects:

$$\hat{f}_e(k) = [1-(1-\alpha)R(k)]\hat{f}_e(k-1) + (1-\alpha)R(k)f_e(k),$$

where R(k) is the squared magnitude of the correlation coefficient, i.e., of the correlation with the reference of the kth record used for frequency offset normalized by the signal power so that R(k) takes on values between 0 and 1.

Figure 2:
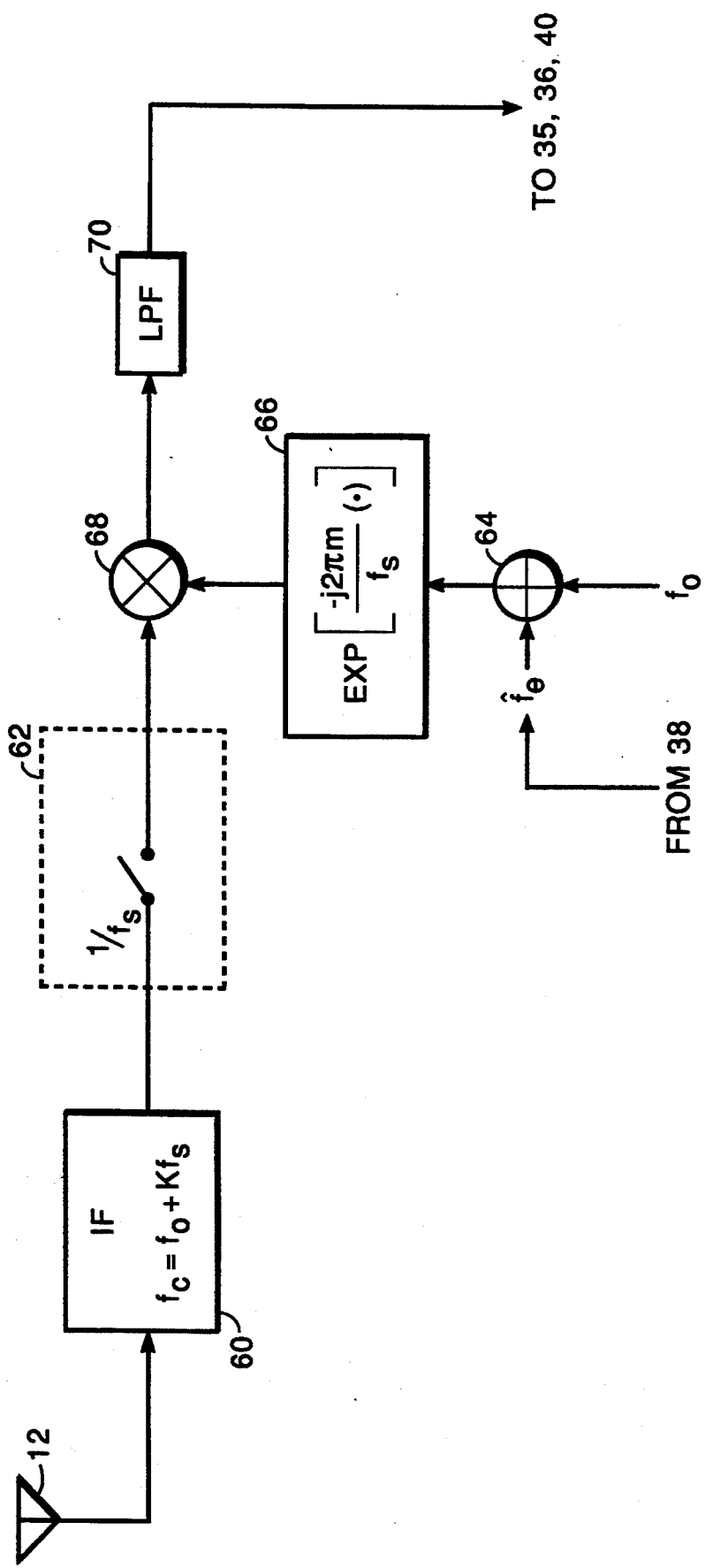
FIG. 2 is a block diagram of the complex-sample-extraction part of an alternate embodiment of the present invention.

Although the invention described above necessarily requires extraction of complex samples, it is not necessary that the complex samples be the immediate result of the original sampling operation. FIG. 2, for instance, depicts an alternate arrangement for obtaining samples referenced to a phase reference. The FIG. 2 arrangement employs the same antenna 12, but a single-channel (real-value) IF strip 60 replaces the parallel channels provided by the splitter 14, two mixers 18 and 22, and In place of the complex-value sampler 32 of FIG. 1, FIG. 2 employs a real-value sampler, which would typically be embodied in a single analog-to-digital converter instead of the two converters represented by complex-value sampler 32 of FIG. 1. In the illustrated embodiment, sampler 62 would typically sample at a rate $f_s$ several times higher than the sampling rate 2/T employed by the complex-valued sampler 32.

In this embodiment, the center frequency $f_c$ of the IF strip 60 is given by $$f_c = f_o + Kf_s,$$

where K is an integer and $f_o$ is an offset frequency whose significance will presently become clear. The spectral content of the (real-valued) signal that issues from IF strip 60, which is centered approximately about $\pm f_c$, is replicated in the (still real-valued) output of sampler 62 as redundant frequency-domain "lobes" that occur at $\pm f_o \pm kf_s, k=0, 1, 2, \ldots$. To extract complex-valued samples, an adder 64 adds $f_o$ to the value $f_e$ computed from the phase rotation in the manner described above and supplies this to a complex-sinusoid generator 66, which generates a complex sinusoid whose frequency equals $-(f_o + f_e)$. A complex multiplier 68 multiplies the resultant signal by the real-valued output of sampler 62 so as to translate the sampler output in frequency by $-(f_o + f_3)$. This translates one of the lobes of the sampler spectrum to baseband, and a lowpass filter 70 suppresses the other, redundant lobes so as to produce properly phased complex-valued samples. The resulting signal (possibly after sub-sampling reflected in the different indices m and n in FIGS. 1 and 2) is then used by the remainder of the circuit in FIG. 1 in the normal manner.

My simulations of the performance of an offset-determination circuit of the present invention indicate that it can outperform not only digital equivalents of phase-locked-loop circuits but also devices of the type described in the Scott et al. application mentioned above. With a two-ray Rayleigh-fading channel model having a delay interval of one symbol period with a simulated vehicle velocity of 50 kilometers per hour, simulations were run with a thousand different starting points. The average correction frequency determined within 50-60 msec by an embodiment of the present invention for a 600-Hz offset was 576 Hz. This was somewhat better than the other two approaches, whose average correction frequencies were 455 Hz and 515 Hz, respectively, in the same time.

More telling, however, are the deviations in these values. With my invention, the standard deviation was 44 Hz for the above-described simulations. In contrast, standard deviations of 815 Hz and 259 Hz, respectively, resulted from the other two approaches. These results show that, for such a sync time, the present invention will yield an error after correction that is almost always less than the 100 Hz that adaptive equalizers for the 24.3 kilobaud digital cellular application are generally felt to be capable of tolerating, while the same is not true of the other approaches.

It is thus clear that the present invention greatly increases the feasibility of making effective correction for frequency offset within a very limited time interval, and it thus constitutes a significant advance in the art.

What is claimed is:

1. In a radio receiver for receiving receiver input signals that result from transmission of sequences of complex-valued symbols, including predetermined reference sequences, the receiver input signals thereby including reference records thereof that result from the transmission of the reference sequences, the combination comprising:
    A) an adjustable-frequency phase reference including:
        i) an analog local oscillator for generating an analog reference signal; and
        ii) a digital sinusoidal-signal generator, responsive to application of a frequency-offset signal thereto, for generating digital phase-offset values that represent successive values of a sinusoidal signal whose frequency is determined by the frequency-offset signal;
    B) means for extracting, from the received input signal, complex input samples referenced to the phase reference, the means for extracting including;
        i) means for generating digital complex values from the received signal by reference to the analog reference signal; and
        ii) a complex multiplier for multiplying the resultant complex values by the phase-offset values produced by the digital sinusoidal-signal generator;
    C) means for determining first and second phase differences between the input samples extracted from first and second parts of the reference record, respectively, and corresponding first and second parts of the reference sequence;
    D) means for determining the phase rotation between the first and second phase differences;
    E) means for adjusting the frequency of the phase reference in accordance with phase rotations thus determined and including means for generating the frequency-offset signal from the determined phase rotations; and
    F) means for producing a receiver output from complex input samples extracted from the received signal in accordance with the phase reference as thus adjusted.

2. In a radio receiver for receiving receiver input signals that result from transmission of sequences of complex-valued symbols, including predetermined reference sequences, the receiver input signals thereby including reference records thereof that result from the transmission of the reference sequences, the combination comprising:
    A) an adjustable-frequency phase reference;
    B) means for extracting, from the received input signal, complex input samples referenced to the phase reference;
    C) means for determining first and second phase differences between the input samples extracted from first and second parts of the reference record, respectively, and corresponding first and second parts of the reference sequence;
    D) means for determining the phase rotation between the first and second phase differences;
    E) means for adjusting the frequency of the phase reference in accordance with phase rotations thus determined between the first and second phase differences only of records the magnitudes of whose correlations with the reference sequence exceed a predetermined threshold; and F) means for producing a receiver output from complex input samples extracted from the received signal in accordance with the phase reference as thus adjusted.

3. In a radio receiver for receiving receiver input signals that result from transmission of sequences of complex-valued symbols, including predetermined reference sequences, the receiver input signals thereby including reference records thereof that result from the transmission of the reference sequences, the combination comprising:

A) an adjustable-frequency phase reference;
B) means for extracting, from the received input signal, complex input samples referenced to the phase reference;
C) means for determining first and second phase differences between the input samples extracted from first and second parts of the reference record respectively, and corresponding first and second parts of the reference sequence;
D) means for determining the phase rotation between the first and second phase differences;
E) means for adjusting the frequency of the phase reference in accordance with an average of the phase rotations thus determined for a plurality of records weighted in accordance with the correlations between the records and the reference sequences; and
F) means for producing a receiver output from complex input samples extracted from the received signal in accordance with the phase reference as thus adjusted.

4. A radio receiver as defined in claim 1 wherein the reference sequence is included in a header portion of the input signal.

5. A radio receiver as defined in claim 2 wherein the means for adjusting the frequency of the plane reference does so in accordance with the phase rotations determined between the first and second phase differences only of records spaced in time by a predetermined interval from records whose correlations with the reference sequence also exceed the predetermined threshold.

* * * * *